(12) United States Patent
Kao et al.

(10) Patent No.: US 10,825,743 B2
(45) Date of Patent: Nov. 3, 2020

(54) ELECTRONIC DEVICE AND METHOD FOR REPAIRING ELECTRONIC DEVICE

(71) Applicant: InnoLux Corporation, Miao-Li County (TW)

(72) Inventors: Ker-Yih Kao, Miao-Li County (TW); Liang-Lu Chen, Miao-Li County (TW); Chin-Lung Ting, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/438,729

(22) Filed: Jun. 12, 2019

(65) Prior Publication Data

US 2020/0013686 A1 Jan. 9, 2020

Related U.S. Application Data

(60) Provisional application No. 62/694,534, filed on Jul. 6, 2018.

(30) Foreign Application Priority Data

Dec. 24, 2018 (CN) .......................... 2018 1 1579972

(51) Int. Cl.
  *H01L 21/66* (2006.01)
  *H01L 25/075* (2006.01)
  *H01L 33/62* (2010.01)
  *H01L 27/12* (2006.01)

(52) U.S. Cl.
  CPC .......... *H01L 22/22* (2013.01); *H01L 25/0753* (2013.01); *H01L 27/1244* (2013.01); *H01L 33/62* (2013.01); *H01L 2933/0066* (2013.01)

(58) Field of Classification Search
  CPC ... H01L 22/22; H01L 25/0753; H01L 25/167; H01L 27/1244; H01L 2933/0066; H01L 33/62
  See application file for complete search history.

(56) References Cited

U.S. PATENT DOCUMENTS

| | | | |
|---|---|---|---|
| 2019/0080650 A1* | 3/2019 | Fu | .......................... G09G 3/3266 |
| 2019/0305199 A1* | 10/2019 | Li | ............................. H05K 1/02 |
| 2020/0035750 A1* | 1/2020 | Li | .......................... H01L 25/167 |

(Continued)

FOREIGN PATENT DOCUMENTS

CN  104637450 A  5/2015

*Primary Examiner* — Jaehwan Oh
(74) *Attorney, Agent, or Firm* — McClure, Qualey & Rodack, LLP

(57) ABSTRACT

An electronic device is provided. The electronic device includes a substrate and an electronic unit disposed on the substrate. The electronic unit includes a light-emitting diode, a conductive structure, a first driving circuit, and a second driving circuit. The conductive structure is disposed between the light-emitting diode and the substrate. The first driving circuit includes a first output wire. The second driving circuit includes a second output wire. The first driving circuit is electrically connected to the light-emitting diode by the conductive structure. The second driving circuit is electrically insulated from the light-emitting diode. In addition, the conductive structure at least partially overlaps the first output wire and the second output wire in a normal direction of the substrate.

14 Claims, 9 Drawing Sheets

(56) References Cited

U.S. PATENT DOCUMENTS

| | | | |
|---|---|---|---|
| 2020/0052033 A1* | 2/2020 | Iguchi | H01L 27/1225 |
| 2020/0152826 A1* | 5/2020 | Lee | G09G 3/3225 |
| 2020/0194406 A1* | 6/2020 | Liu | H01L 25/0753 |

* cited by examiner

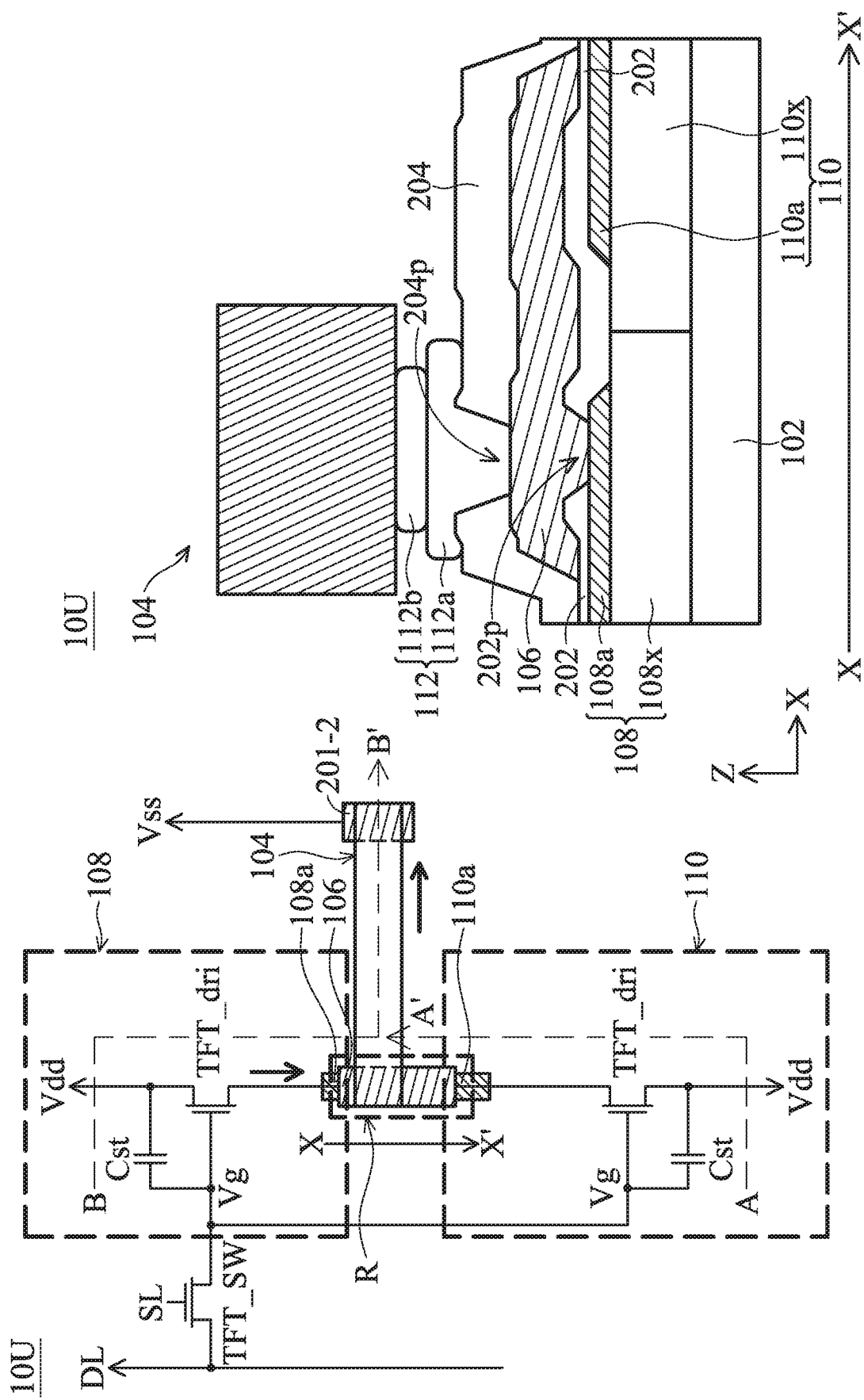

ELECTRONIC DEVICE AND METHOD FOR REPAIRING ELECTRONIC DEVICE

CROSS REFERENCE TO RELATED APPLICATIONS

This application claims priority of U.S. Provisional Patent Application No. 62/694,534, filed on Jul. 6, 2018 and Chinese Patent Application No. 201811579972.5, filed on Dec. 24, 2018, the entirety of which is incorporated by reference herein.

BACKGROUND

Technical Field

The present disclosure relates to an electronic device, and in particular it relates to a repaired structure of an electronic device and a method for repairing an electronic device.

Description of the Related Art

The light-emitting diode (LED) is controlled by the driving circuit to modulate the brightness of the light-emitting diode. The driving circuit may be damaged (e.g., the circuit wire may be broken) or short-circuited, and the testing result may determine that the driving circuit does not conform to specifications. Therefore, how to repair such circuits has currently become an important issue. The present disclosure provides the structure of an electronic device and a method for repairing the electronic device, which may reduce the complexity of the repair process or reduce the repair time.

SUMMARY

In accordance with some embodiments of the present disclosure, an electronic device is provided. The electronic device includes a substrate and an electronic unit disposed on the substrate. The electronic unit includes a light-emitting diode, a conductive structure, a first driving circuit and a second driving circuit. The conductive structure is disposed between the light-emitting diode and the substrate. The first driving circuit includes a first output wire. The second driving circuit includes a second output wire. The first driving circuit is electrically connected to the light-emitting diode by the conductive structure. The second driving circuit is electrically insulated from the light-emitting diode. In addition, the conductive structure at least partially overlaps the first output wire and the second output wire in a normal direction of the substrate.

In accordance with some embodiments of the present disclosure, a method for repairing an electronic device is provided. The method includes providing an electronic device. The electronic device includes a substrate and an electronic unit disposed on the substrate. The electronic unit includes a light-emitting diode, a conductive structure, a first driving circuit, and a second driving circuit. The conductive structure is disposed between the light-emitting diode and the substrate. The first driving circuit is electrically connected to the light-emitting diode by the conductive structure. The second driving circuit is electrically insulated from the light-emitting diode. The method also includes disconnecting the first driving circuit and the light-emitting diode. The method further includes performing a repair step to electrically connect the conductive structure to the second driving circuit. In addition, the conductive structure at least partially overlaps the output wire of the second driving circuit in a normal direction of the substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 2A illustrates a circuit diagram of an electronic unit in accordance with some embodiments of the present disclosure;

FIG. 2B illustrates a cross-sectional diagram of an electronic unit along the direction of the line-segment X-X' in the region R of FIG. 2A in accordance with some embodiments of the present disclosure;

DETAILED DESCRIPTION

Figure 1:
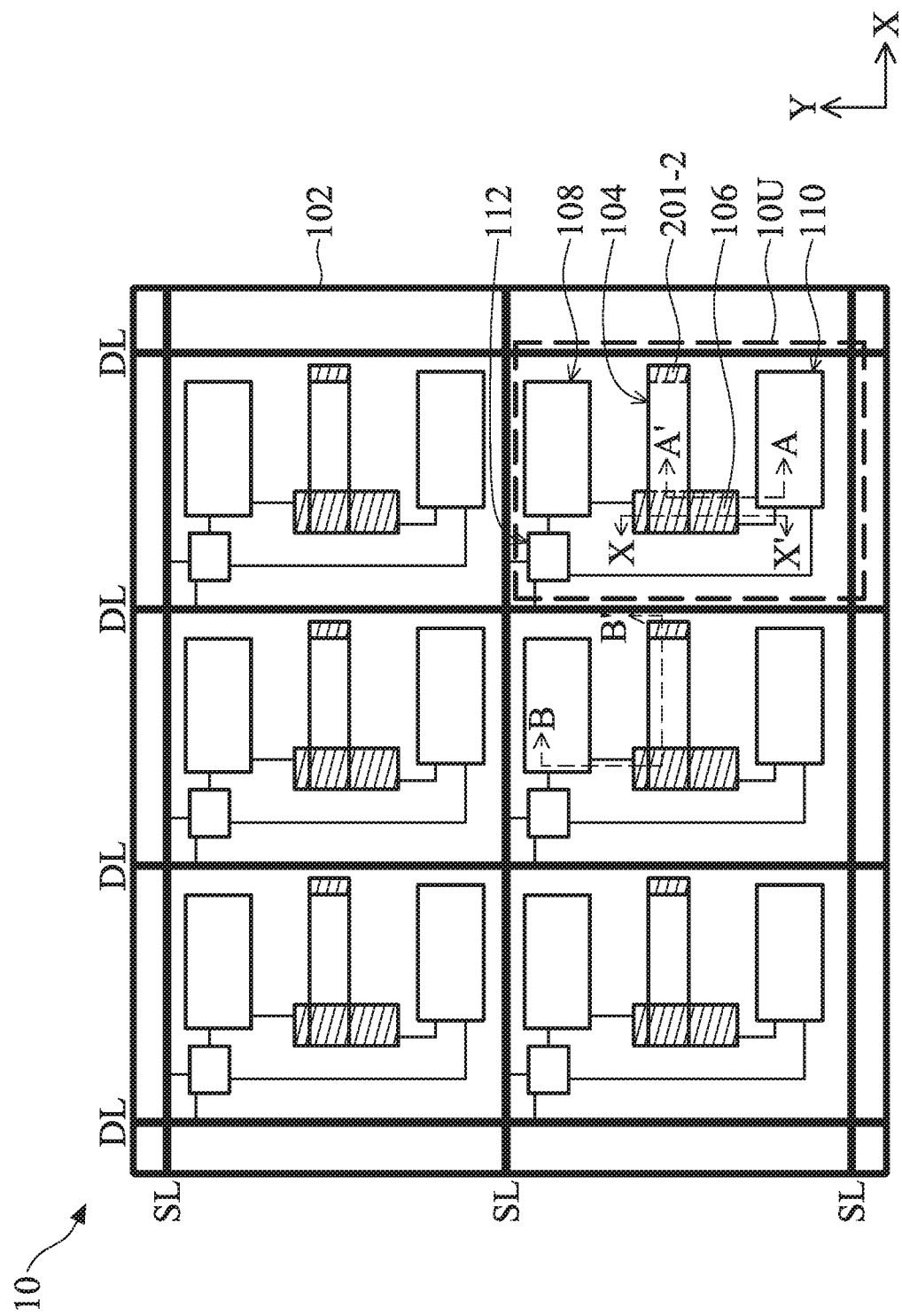
FIG. 1 illustrates a structural diagram of an electronic device in accordance with some embodiments of the present disclosure.

The structure of the electronic device and the method for repairing the electronic device of the present disclosure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the concept of the present disclosure may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

It should be understood that this description of the exemplary embodiments is intended to be read in connection with the accompanying drawings, which are to be considered part of the entire written description. The drawings are not drawn to scale. In addition, structures and devices are shown in order to simplify the drawing.

It should be noted that the elements or devices in the drawings of the present disclosure may be present in any form or configuration known to those with ordinary skill in the art. In addition, the expressions "a layer overlaps another layer", "a layer is disposed above another layer", and "a layer is disposed on another layer" may indicate that the layer is in direct contact with the other layer, or that the layer is not in direct contact with the other layer, there being one or more intermediate layers disposed between the layer and the other layer.

It should be understood that, although the terms first, second, third etc. may be used herein to describe various elements, components, regions, layers, portions and/or sections, these elements, components, regions, layers, portions and/or sections should not be limited by these terms. These terms are used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

The terms "about" and "substantially" typically mean+/−20% of the stated value, +/−10% of the stated value, more typically mean+/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

In addition, the phrase "in a range between a first value and a second value" or "in a range from a first value to a second value" indicates that the range includes the first value, the second value, and other values between them.

In addition, in some embodiments of the present disclosure, terms concerning attachments, coupling and the like, such as "connected" and "interconnected" refer to a relationship wherein structures are secured or attached to one another either directly or indirectly through intervening structures.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, the electronic device may include a preset driving circuit and a spare driving circuit, and a conductive structure partially overlaps the output wire of the preset driving circuit and the output wire of the spare driving circuit. When the preset driving circuit can have normal functions, the light-emitting diode may be electrically connected to the preset driving circuit by the conductive structure, and the light-emitting diode is electrically insulated from the spare driving circuit. When the preset driving circuit is damaged or does not meet the specifications, the light-emitting diode may be electrically connected to the spare driving circuit by the conductive structure, and the light-emitting diode may be electrically insulated from the preset driving circuit. In some embodiments, a new current conducting path may be established in the repair steps so that the conductive structure may be electrically connected to the spare driving circuit.

FIG. 1 is a structural diagram of an electronic device 10 in some embodiments of the present disclosure. It should be understood that additional features may be added to the electronic device 10 in some embodiments. In some embodiments, some of the features described below may be replaced or omitted. The electronic device 10 may include, but is not limited to, a display device, a light-emitting device, a detection device, a tiled device or other suitable devices.

As shown in FIG. 1, the electronic device 10 may include a substrate 102 and a plurality of electronic units 10U disposed on the substrate 102. Specifically, the electronic device 10 may include a plurality of data lines DL and a plurality of scan lines SL disposed on the substrate 102. For example, the scan lines SL may extend along the X direction, and the data lines DL may extend along the Y direction. In addition, the X direction may be different from the Y direction. In some embodiments, the X direction is substantially perpendicular to the Y direction, but it is not limited thereto. In some embodiments, the data line DL and the scan line SL may intersect with each other to form an included angle. The included angle may be substantially ranged from about 45 degrees to about 90 degrees, but it is not limited thereto. In some embodiments, the plurality of scan lines SL and the plurality of data lines DL intersect with each other to define the plurality of electronic units 10U, but they are not limited thereto.

FIG. 1 merely shows a few electronic units 10U for exemplary illustrations, and the number of electronic units 10U is not limited. The electronic device 10 may be provided with any suitable number of electronic units 10U according to needs.

In some embodiments, the substrate 102 may be an array substrate. In some embodiments, the material of the substrate 102 may include, but is not limited to, glass, quartz, sapphire, polycarbonate (PC), polyimide (PI), polyethylene terephthalate (PET), glass fibers, another suitable substrate material or a combination thereof. In some embodiments, the substrate 102 may include a metal-glass fiber composite plate, a metal-ceramic composite plate or a printed circuit board.

In some embodiments, the electronic device 10U may include a light-emitting diode 104, a conductive structure 106, a first driving circuit 108, and a second driving circuit 110. In some embodiments, the light-emitting diode 104 may include, but is not limited to, a light-emitting diode (LED), a micro light-emitting diode (micro LED or mini LED), an organic light-emitting diode (OLED), and a quantum dot organic light-emitting diode (QLED), a quantum dot (QD) or another suitable light-emitting diode. In some embodiments, the type of the light-emitting diode 104 may include a vertical chip type or a flip chip type, but it is not limited thereto.

In some embodiments, the electronic unit 10U may include a first driving circuit 108 and a second driving circuit 110. The first driving circuit 108 and the second driving circuit 110 may respectively serve as a preset driving circuit and a spare driving circuit. Specifically, when the first driving circuit 108 (preset driving circuit) is damaged or does not meet the specifications, the conducting path between the first driving circuit 108 and the light-emitting diode 104 may be cut off (disconnected). In this way, the first driving circuit 108 may be electrically insulated from the light-emitting diode 104. Then, a conductive path between the second driving circuit 110 (the spare driving circuit) and the light-emitting diode 104 may be established, the second driving circuit 110 may be electrically connected to the light-emitting diode 104.

Figure 2C:
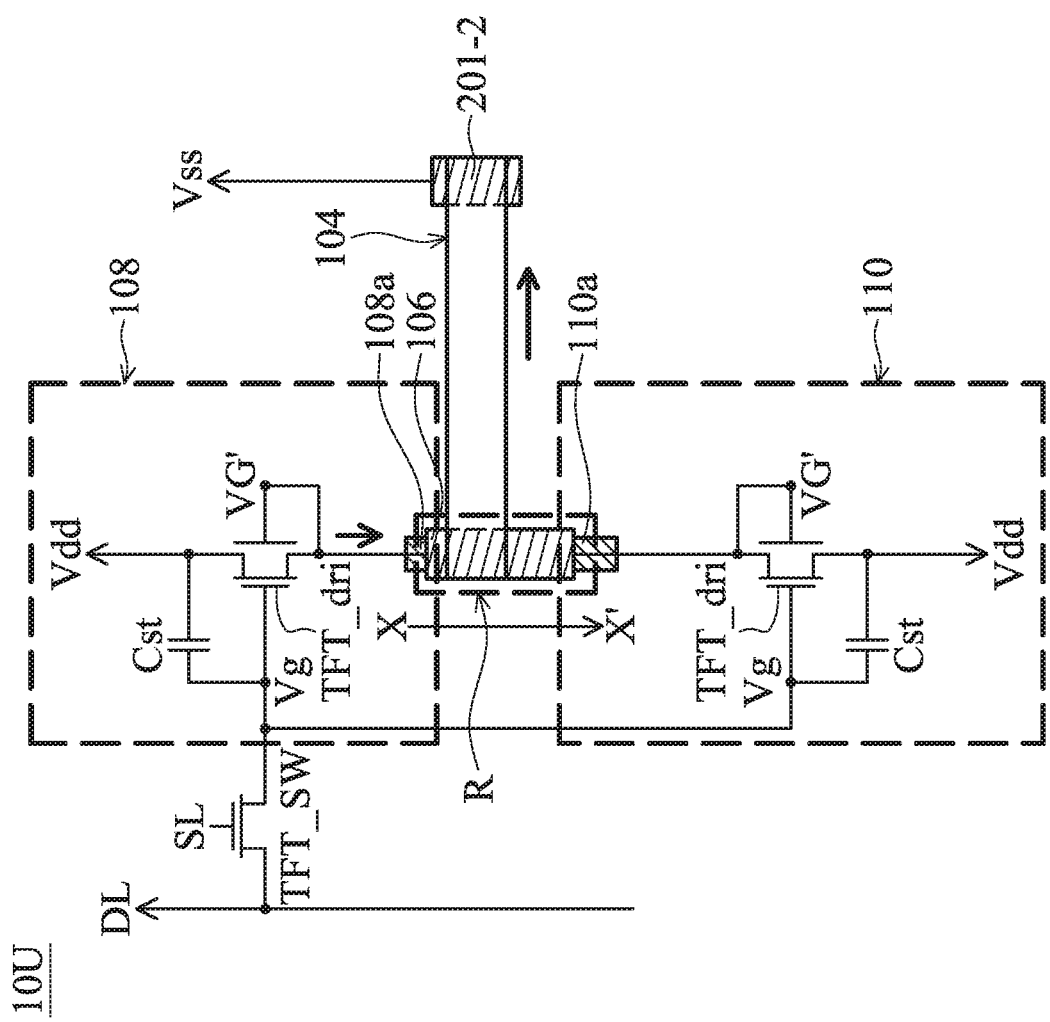
FIG. 2C illustrates a circuit diagram of an electronic unit in accordance with some embodiments of the present disclosure.

In some embodiments, as shown in FIGS. 2A-2C, the first driving circuit 108 and the second driving circuit 110 may each include at least one driving transistor TFT_dri, and the electronic unit 10U may include a switching transistor TFT_SW connected to the data line DL and the scan line SL. In some embodiments, the switching transistor TFT_SW may be electrically connected to the first driving circuit 108 and the second driving circuit 110.

In some embodiments, the ratio of an area of the conductive structure 106 to an area of the electronic unit 10U in the Z direction (i.e. the normal direction of the substrate 102) may be in a range from about 0.005 to about 0.5. In some embodiments, the area of the electronic unit 10U (referring to FIG. 1) may be substantially defined as the area enclosed by the adjacent two scan lines SL and the adjacent two data lines DL. The area of the electronic unit 10U may be an area enclosed by the same side of the adjacent two scanning lines SL and between the same side of the adjacent two data s DL, but it is not limited thereto. The area of the conductive structure 106 may be defined as the area of the conductive structure 106 as viewed in the Z direction.

FIG. 2A is a circuit diagram of the electronic unit 10U in some embodiments of the present disclosure. As described above, the electronic unit 10U may include the first driving circuit 108 and the second driving circuit 110. As shown in FIG. 2A, the electronic unit 10U may include at least one switching transistor TFT_SW, at least two driving transistors TFT_dri, and a capacitor Cst. In some embodiments, the driving transistor TFT_dri may be a three-terminal element (including a gate, a drain, and a source), but it is not limited thereto. It should be noted that the circuit structure of the first driving circuit 108 and the second driving circuit 110 or the framed area in FIG. 2A is merely an exemplary diagram. In some examples, other transistors (e.g., reset transistors), other capacitors, or other components may be provided according to needs. In addition, it should be noted that the connection way of the driving transistor TFT_dri in FIG. 2A is for exemplary illustration, which may be adjusted according to actual needs.

In addition, FIG. 2A illustrates a part of structural components of the electronic unit 10U, such as the light-emitting diode 104, the conductive structure 106, the first output wire 108a of the first driving circuit 108, and the second output wire 110a of the second driving circuit 110, to clearly describe the arrangement between the circuit and the structural components in the electronic unit 10U. In the embodiment shown in FIG. 2A, one switching transistor TFT_SW may be electrically connected to the first driving circuit 108 and the second driving circuit 110, but it is not limited thereto. In some embodiments, the electronic unit 10U may include two switching transistors TFT_SW, and the two switching transistors TFT_SW may be electrically connected to the first driving circuit 108 and the second driving circuit 110, respectively.

As shown in FIG. 2A, the first driving circuit 108 (e.g., the preset driving circuit) includes the first output wire 108a, and the second driving circuit 110 (e.g., the spare drive circuit) includes a second output wire 110a. In some embodiments, as shown in FIG. 2A, the first output wire 108a is electrically connected to the light-emitting diode 104 by the conductive structure 106, and the direction of the arrow (bold wire) in the figure represents the transmission direction of current. In other words, the first output wire 108a is electrically connected to the light-emitting diode 104, and the second driving circuit 110 is electrically insulated from the light-emitting diode 104.

FIG. 2B illustrates a cross-sectional diagram of the electronic unit 10U along the direction of line-segment X-X' in the region R of FIG. 2A in accordance with some embodiments. As shown in FIG. 2B, the first driving circuit 108 and the second driving circuit 110 may be disposed on the substrate 102. The first driving circuit 108 may include the first output wire 108a and a first driving unit 108x (referring to FIG. 7 for detailed structure). The second driving circuit 110 may include the second output wire 110a and a second driving unit 110x (referring to FIGS. 5 and 6 for detailed structure). In some embodiments, the conductive structure 106 may at least partially overlap the first output wire 108a and the second output wire 110a in the Z direction. In some embodiments, the conductive structure 106 may be disposed between the light-emitting diode 104 and the substrate 102.

The material of the first output wire 108a and the second output wire 110a may include, but is not limited to, copper (Cu), aluminum (Al), tungsten (W), titanium (Ti), gold (Au), silver (Ag), molybdenum (Mo), another suitable electrically conductive material or a combination thereof. In some embodiments, the first output wire 108a and the second output wire 110a may include a single conductive layer or a composite conductive layer. In some embodiments, the material of the first output wire 108a and the second output wire 110a may include a composite conductive layer of molybdenum/aluminum/molybdenum, but it is not limited thereto.

Moreover, the electronic unit 10U may include a dielectric layer 202 disposed between the conductive structure 106 and the first output wire 108a, and the dielectric layer 202 disposed between the conductive structure 106 and the second output wire 110a. For example, the dielectric layer 202 may disposed between the conductive structure 106 and the first output wire 108a, and the dielectric layer 202 may be disposed between the conductive structure 106 and the second output wire 110a in the Z direction. In some embodiments, as shown in FIG. 2B, the dielectric layer 202 may include a hole 202p. Moreover, the hole 202p may overlap a portion of the first output wire 108a in the Z direction. In some embodiments, the hole 202p may expose a portion of the first output wire 108a. In some embodiments, the conductive structure 106 may be electrically connected to the first output wire 108a through the hole 202p. In some embodiments, a portion of the conductive structure 106 may be disposed (or filled) in the hole 202p and in contact with the first output wire 108a.

In this embodiment, the dielectric layer 202 corresponding to or overlapping the second output wire 110a in the Z direction does not have the hole, and the conductive structure 106 is not in contact with the second output wire 110a. That is, the conductive structure 106 is electrically insulated from the second output wire 110a. In some embodiments, the electronic unit 10U may include at least one dielectric layer disposed between the conductive structure 106 and the first output wire 108a, and the at least one dielectric layer disposed between the conductive structure 106 and the second output wire 110*a* in the Z direction. In some embodiments, the conductive structure 106 may be disposed on the first driving circuit 108 and the second driving circuit 110 in the Z direction. In some embodiments, the conductive structure 106 may be disposed on the first output wire 108*a* and the second output wire 110*a* in the Z direction.

In some embodiments, the material of the conductive structure 106 may have low resistance. For example, the material of the conductive structure 106 may include, but is not limited to, copper, molybdenum, nickel, gold, silver, tin, aluminum, zinc, another suitable conductive material or a combination thereof. In some embodiments, the material of the conductive structure 106 may include a single conductive layer, multiple conductive layers or a composite conductive layer. In some embodiments, the material of the conductive structure 106 may include a composite conductive layer of molybdenum/copper, but it is not limited thereto. In some embodiments, the dielectric layer 202 may include, but is not limited to, silicon oxide, silicon nitride, silicon oxynitride, another suitable dielectric material or a combination thereof.

In some embodiments, a protective layer 204 may be disposed on the conductive structure 106, and a connecting element 112 may be disposed between the light-emitting diode 104 and the conductive structure 106. In some embodiments, the connecting element 112 may include a single conductive layer, multiple conductive layers or a composite conductive material. In some embodiments, the connecting element 112 may include a first conductive layer 112*a* and a second conductive layer 112*b*.

In some embodiments, the material of the first conductive layer 112*a* and/or the second conductive layer 112*b* may include a conductive material having low resistance, or a conductive material having anti-corrosion property, but it is not limited thereto. In some embodiments, the material of the first conductive layer 112*a* and/or the second conductive layers 112*b* may include, but is not limited to, tin, nickel, gold, copper, silver, indium, zinc, antimony, tin alloys, nickel alloys, gold alloys, copper alloys, silver alloys, indium alloys, zinc alloys, antimony alloys or a combination thereof. In some embodiments, the material of the first conductive layer 112*a* may include nickel-gold alloys. In some embodiments, the material of the second conductive layer 112*b* may include solder materials, such as tin, but it is not limited thereto.

In some embodiments, the protective layer 204 may include a hole 204*p*, and the connecting element 112 may be electrically connected to the conductive structure 106 through the hole 204*p*. In some embodiments, the material of the protective material may include an inorganic material or an organic material, such as silicon nitride, silicon oxide, silicon oxynitride, aluminum oxide, epoxy resin, acrylic resin, polymethylmethacrylate (PMMA), another suitable material or a combination thereof, but it is not limited thereto.

FIG. 2B illustrates a cross-sectional diagram of the electronic unit 10U along the direction of line-segment X-X' in the region R of FIG. 2A. FIG. 2B does not illustrate the entire structure of the light-emitting diode 104 and it merely illustrates the connection relationship of one end of the light-emitting diode 104 (for example, a cathode or an anode), the connecting element 112 and the conductive structure 106. In some embodiments, the light-emitting diode 104 may include a p-type semiconductor layer (not illustrated), an n-type semiconductor layer (not illustrated), and a light-emitting layer (not illustrated) disposed between the p-type semiconductor layer and the n-type semiconductor layer, or another suitable layer. In addition, the first driving circuit 108 and the second driving circuit 110 are only roughly illustrated to show their relative relationship with the conductive structure 106. The detailed stacked structures of the first driving circuit 108 and the second driving circuit 110 may be referred in FIGS. 5 to 7.

FIG. 2C illustrates a circuit diagram of the electronic unit 10U in accordance with some other embodiments. The embodiment of FIG. 2C is substantially similar to FIG. 2A. One of the differences between them is that the driving transistor TFT_dri in the embodiment of FIG. 2C is a four-terminal element (including two gates, one source and one drain).

Figures 3A, 3B:
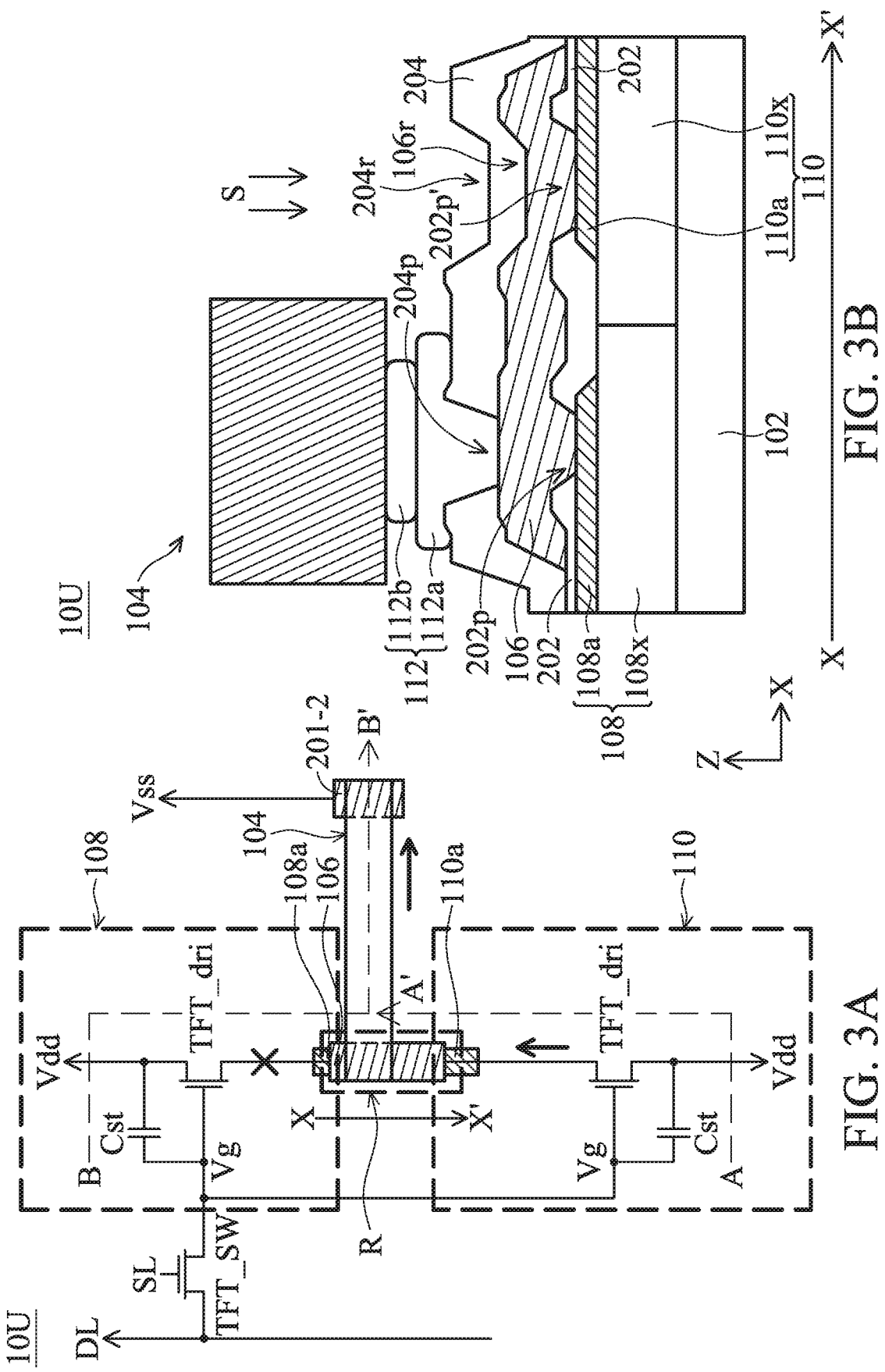
FIG. 3A illustrates a circuit diagram of an electronic unit in accordance with some embodiments of the present disclosure.
FIG. 3B illustrates a cross-sectional diagram of an electronic unit along the direction of the line-segment X-X' in the region R of FIG. 3A in accordance with some embodiments of the present disclosure.

FIG. 3A illustrates a circuit diagram of the electronic unit 10U in accordance with some other embodiments. The difference between the circuit diagram shown in FIG. 3A and FIG. 2A is that, in the embodiment shown in FIG. 3, the conductive path between the first driving circuit 108 and the light-emitting diode 104 may be disconnected (the symbol X in the figure represents the conductive path is disconnected) since the first driving circuit 108 is damaged or does not meet the specifications. Therefore, the first driving circuit 108 and the light-emitting diode 104 may be electrically insulated. The conductive path between the second driving circuit 110 and the light-emitting diode 104 may be established, i.e. the second driving circuit 110 may be electrically connected to the light-emitting diode 104. In this embodiment, the light-emitting diode 104 may be electrically connected to the second output wire 110*a* of the second driving circuit 110 by the conductive structure 106, the current between the second driving circuit 110 and the light-emitting diode 104 may be conducted, the current direction is shown by the arrow (bold line) in the figure.

FIG. 3B illustrates a cross-sectional diagram of the electronic unit 10U along the direction of the line-segment X-X' in the region R of FIG. 3A in accordance with some embodiments. The embodiment shown in FIG. 3B is substantially similar to FIG. 2B. The difference between them is that, in the embodiment shown in FIG. 3B, the dielectric layer 202 corresponding to or overlapping the second output wire 110*a* in the Z direction may include a hole 202*p*'. The hole 202*p*' may expose a portion of the second output wire 110*a*. With such a configuration, the conductive structure 106 may be electrically connected to the second output wire 110*a* through the hole' 202*p*. That is, the conductive structure 106 is electrically connected to the second output wire 110*a* through the hole 202*p*' and the conductive path may be established. In this embodiment, the conductive path between the first driving circuit 108 and the light-emitting diode 104 is disconnected, i.e. the first driving circuit 108 is electrically insulated from the light-emitting diode 104.

In some embodiments, the conductive structure 106 may be electrically connected to the second output wire 110*a* by performing a repair step S. In some embodiments, the repair step S may include forming the hole 202*p*' in the dielectric layer 202, and the conductive structure 106 may be disposed (or filled) in the hole 202*p*', the conductive structure 106 may be electrically connected to the second output wire 110*a* (the spare driving circuit). In some embodiments, the repair step S may provide an energy impact on the dielectric layer 202 so that the above hole 202*p*' may be formed in the dielectric layer 202, and the conductive structure 106 may be in a melting state. Meanwhile, the conductive structure 106 may be disposed (or filled) in the hole 202*p*'. Therefore, the conductive structure 106 may be electrically connected to the second output wire 110*a* through the hole 202*p*'. In some embodiments, after the repair step S, a recessed portion 106r and a recessed portion 204r may be formed on the conductive structure 106 and the protective layer 204, respectively, but it are not limited thereto.

In some embodiments, the repair step S may include a laser melting process, and the laser types or laser power may be adjusted depending on the material of the dielectric layer 202 or the conductive structure 106, or other factors.

Figure 4:
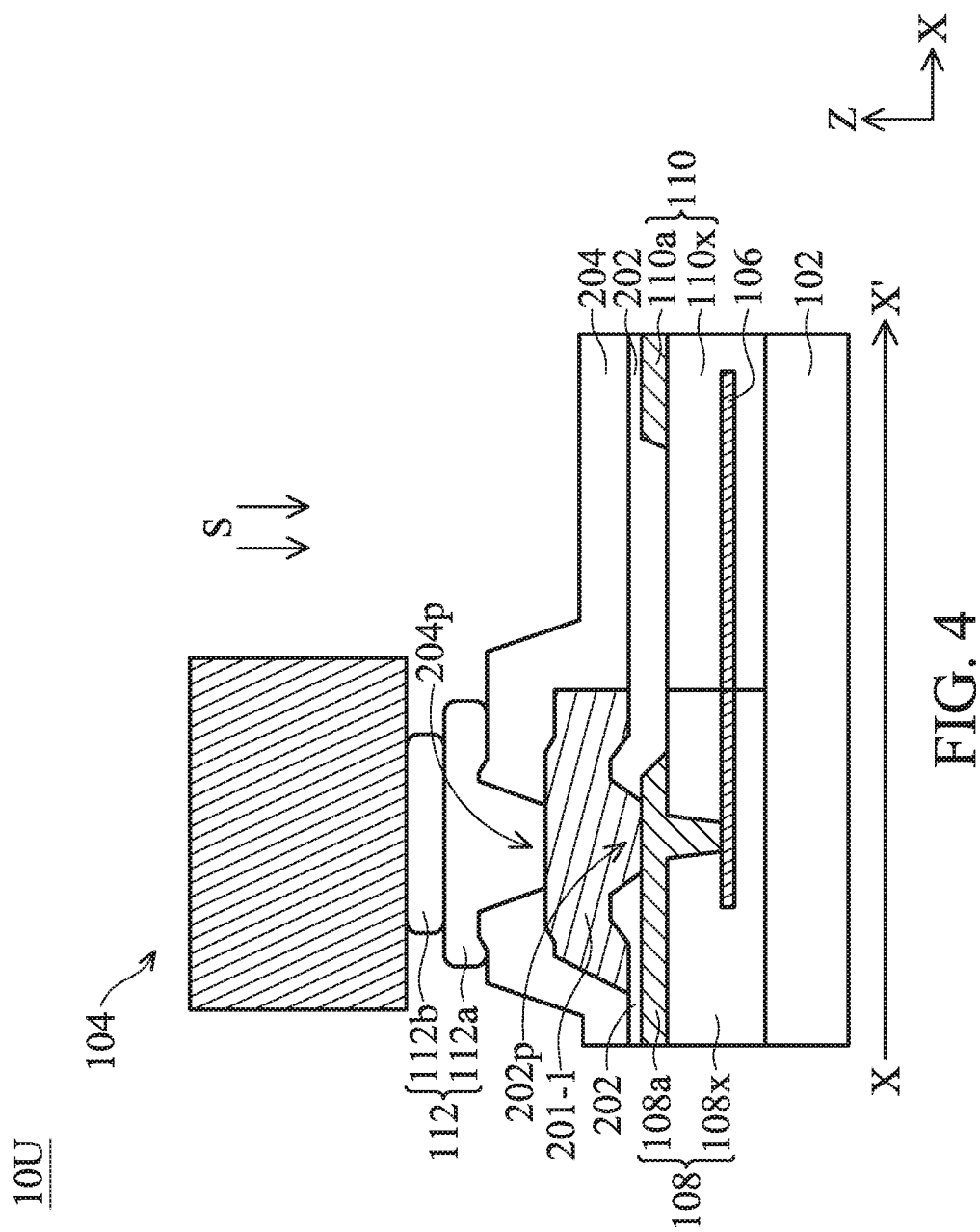
FIG. 4 illustrates a cross-sectional diagram of an electronic unit along the line-segment X-X' in FIG. 1 in accordance with some embodiments of the present disclosure.

FIG. 4 illustrates a cross-sectional diagram of the electronic unit 10U along the line-segment X-X' in FIG. 1 (or in FIG. 2A or FIG. 2C) in accordance with some other embodiments of the present disclosure. The embodiment shown in FIG. 4 is substantially similar to FIG. 2B. The difference between them is that, in the embodiment shown in FIG. 4, the conductive structure 106 is disposed between the first output wire 108a (and/or the second output wire 110a) and the substrate 102 in the Z direction. In addition, the conductive structure 106 may overlap with a portion of the first output wire 108a and a portion of the second output wire 110a in the Z direction. In this embodiment, for example, at least one dielectric layer (not illustrated) may be disposed between the first output wire 108a and the second output wire 110a, and the conductive structure 106 in the Z direction. In addition, the specific number of dielectric layers between the first output wire 108a and second output wires 110a, and the conductive structure 106 may be adjusted according to needs. In this embodiment, the conductive structure 106 may be the same layer as one of conductive layer in the first driving circuit 108 (and/or the second driving circuit 110). One may refer to FIGS. 5 to 7 for a detailed description of the structures of the first driving circuit 108 and the second driving circuit 110. In some embodiments, the conductive structure 106 may be the same layer as a gate electrode 304G of the driving transistor TFT_dri. In some embodiments, the conductive structure 106 may be the same layer as a drain electrode 308D or a source electrode 308S of the driving transistor TFT_dri. In some embodiments, the conductive structure 106 may include other conductive layers in the first driving circuit 108 and the second driving circuit 110, but it is not limited thereto. It should be noted that when the conductive structure 106 is formed of any conductive layer in the first driving circuit 108 and the second driving circuit 110, the conductive structure 106 may be not connected to other structures formed of the same conductive layer.

In addition, in the embodiment shown in FIG. 4, the first driving circuit 108 is electrically connected to the first output wire 108a, and the second driving circuit 110 is electrically connected to the second output wire 110a. The conductive structure 106 is disposed between the first output wire 108a (and/or the second output wire 110a) and the substrate 102 in the Z direction. Thus, the conductive structure 106 is the conductive layer located below the first output wire 108a (and/or the second output wire 110a). For example, a conductive pad 201-1 may be disposed between the connecting element 112 and the first output wire 108a. The conductive pad 201-1 may be electrically connected to the connecting element 112 and the first output wire 108a. In some embodiments, the conductive pad 201-1 may partially overlap the first output wire 108a and/or the connecting element 112 in the Z direction. In some embodiments, the conductive pad 201-1 may do not overlap or partially overlap the second output wire 110a in the Z direction. In some embodiments, the material of the conductive pad 201-1 may be the same as or different from the material of the conductive structure 106 in the embodiments of FIGS. 2A-2B as described above, and thus will not be repeated here. In some embodiments, the material of the conductive pad 201-1 and the material of the conductive pad 201-2 (as shown in FIG. 1) may be the same or different. In this embodiment, the conductive pad 201-1 may serve as a connection between the first output wire 108a and the connecting element 112, and the conductive pad 201-1 may improve the adhesion between the first output wire 108a and the connecting element 112, but it is not limited thereto.

Similarly, the conductive structure 106 may be electrically connected to the first output wire 108a or the second output wire 110a, and the conductive structure 106 may be electrically insulated from the other of the first output wire 108a or the second output wire 110a. FIG. 4 is a diagram illustrating a state in which the conductive structure 106 is electrically connected to the first output wire 108a, and the conductive structure 106 is electrically insulated from the second output wire 110a. In some embodiments, the conductive path between the conductive structure 106 and the first driving circuit 108 may be disconnected, and the conductive structure 106 may be electrically connected to the second output wire 110a in the repair step, for example, in a manner similar to those shown in FIG. 2B and FIG. 3B. It should be noted that, when there are more dielectric layers between the conductive structure 106 and the first output wire 108a (and/or the second output wire 110a) in the Z direction, the conductive structure 106 needs to pass through more holes of the dielectric layers to be electrically connected to the first output wire 108a (or the second output wire 110a).

Figure 5:
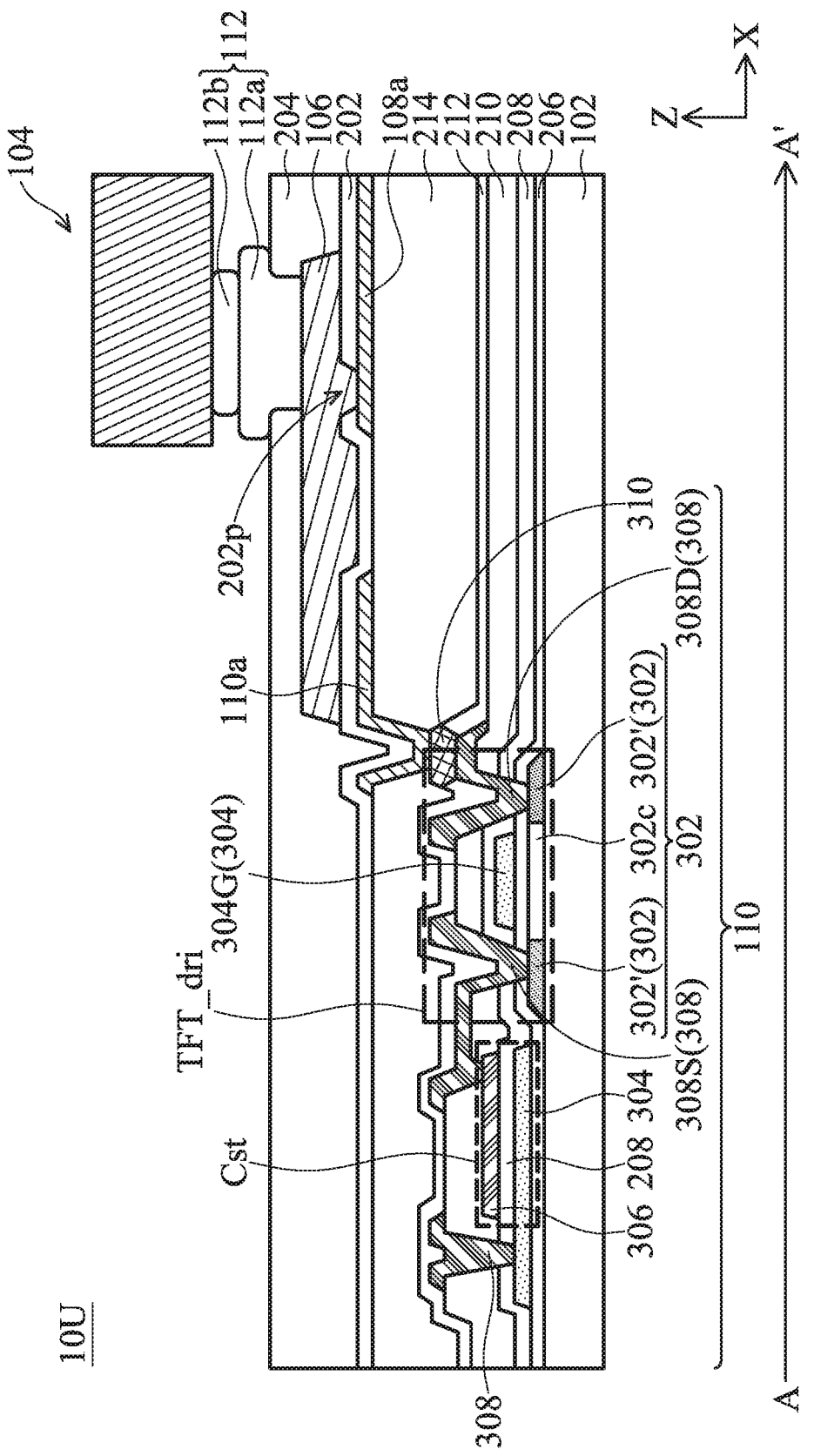
FIG. 5 illustrates a cross-sectional diagram of an electronic unit along the line-segment A-A' in FIG. 2A in accordance with some embodiments of the present disclosure.

FIG. 5 illustrates a cross-sectional diagram of the electronic unit 10U along the line-segment A-A' in FIG. 2A in accordance with some embodiments. For example, the line segment A-A' may extend from the second driving circuit 110 to a part of the light-emitting diode 104. As shown in FIG. 5, the driving transistor TFT_dri and the capacitor Cst of the second driving circuit 110 may be disposed on the substrate 102. Specifically, an active layer 302, a gate dielectric layer 206, an electrode layer 304, a dielectric layer 208, a conductive layer 306, a dielectric layer 210, a conductive layer 308, a dielectric layer 212, a conductive layer 310, and a planarization layer 214 may be sequentially disposed on the substrate 102, but it is not limited thereto. For example, a portion of the electrode layer 304 may serve as the gate electrode 304G of the driving transistor TFT_dri, a portion of the electrode layer 304 may serve as a conductive layer for forming the capacitor Cst, and another portion of the electrode layer 304 may be used as a scan line (not illustrated in FIG. 5). For example, the conductive layer 306 may serve as another conductive layer for forming the capacitor. In addition, a portion of the conductive layer 308 may serve as the drain electrode 308D or the source electrode 308S of the driving transistor TFT_dri, and another portion of the conductive layer 308 may be used as a data line (not illustrated in FIG. 5). The conductive layer 310 may serve as a connecting pad. Specifically, a portion of the electrode layer 304, a portion of the dielectric layer 208, and a portion of the conductive layer 306 may generate the capacitor Cst, but it is not limited thereto. The stacked structure described above can be adjusted according to needs. In addition, the above layers may be replaced or deleted as needed, and other layers may be added to the above structure as needed in accordance with some embodiments. In some embodiments, a buffer layer, a barrier layer or other suitable structures may be additionally disposed between the substrate 102 and the active layer 302, but it is not limited thereto.

In some embodiments, the active layer 302 may include semiconductor portions 302' having suitable dopants and a channel region 302c formed between the two semiconductor portions 302'. In some embodiments, the semiconductor portions 302' may be disposed corresponding to the source electrode 308S and the drain electrode 308D respectively. In other words, the semiconductor portions 302 may partially overlap the source electrode 308S and the drain electrode 308D in the Z direction respectively, but it not limited thereto. In some embodiments, the semiconductor portions 302' are electrically connected to the source electrode 308S and the drain electrode 308D respectively. In some embodiments, the material of the active layer 302 may include, but is not limited to, a semiconductor material, such as amorphous silicon, polycrystalline silicon, metal oxides, or a combination thereof. It should be noted that although the light-emitting diode 104 illustrated in FIG. 5 (or FIGS. 2A to 3A) is connected to the drain electrode, but it is not limited thereto. In other embodiments, the light-emitting diode 104 may be connected to the source electrode.

In some embodiments, the source electrode 308S of the driving transistor TFT_dri may be electrically connected to the capacitor Cst. In some embodiments, the conductive layer 310 may serve as a connecting pad for electrically connected the second output wire 110a and the drain electrode 308D, but it is not limited thereto. In some embodiments, the second driving circuit 110 (or the first driving circuit 108) may not include the conductive layer 310, and the second output wire 110a (or the first output circuit 108a) may be in contact with the conductive layer 308.

In some embodiments, the material of the conductive layer 306, conductive layer 308 and/or conductive layer 310 may include, but is not limited to, a metal conductive material, a transparent conductive material or a combination thereof. In some embodiments, the conductive layer 306, conductive layer 308 and conductive layer 310 may include a single conductive layer, multiple conductive layers, or a composite conductive material. In some embodiments, the conductive layer 306 and the conductive layer 308 may include a composite conductive layer of molybdenum-aluminum-molybdenum (Mo/Al/Mo). The transparent conductive material may include, but is not limited to, indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), another suitable material or a combination thereof.

In some embodiments, the dielectric layer 210 and the dielectric layer 212 may serve as inter-layer dielectrics (ILDs). The material of the dielectric layer 210 and the planarization layer 214 each may include an inorganic material or an organic material. The inorganic material may include, but is not limited to, silicon nitride, silicon oxide, silicon oxynitride, aluminum oxide, another suitable material or a combination thereof.

The cross-sectional structural diagram shown in FIG. 5 may correspond to the electronic unit 10U shown in FIG. 2A, wherein the first driving circuit 108 is electrically connected to the light-emitting diode 104. As shown in FIG. 5, the dielectric layer 202 may include the hole 202p. The hole 202p may expose a portion of the first output wire 108a. The conductive structure 106 may be electrically connected to the first output wire 108a through the hole 202p. In other words, a portion of the conductive structure 106 may be disposed (or filled) in the hole 202p, and the conductive structure 106 may be electrically connected to or be in contact with the first driving circuit 108. Therefore, the first driving circuit 108 may be electrically connected to the light-emitting diode 104 by the conductive structure 106. In the embodiment, the second output wire 110a of the second driving circuit 110 may be electrically insulated from the conductive structure 106, since the second output wire 110a is spaced apart from the conductive structure 106 by the dielectric layer 202. Therefore, the second driving circuit 110 may be insulated from the light-emitting diode 104.

It should be understood that, the structure and type of the thin-film transistor are not limited in the present disclosure. The structure and type of the thin-film transistor may be selected according to needs. The thin-film transistor in the embodiments of the present disclosure may include, but is not limited to, a top gate thin-film transistor, a bottom gate thin-film transistor, a dual gate thin-film transistor or a double gate thin-film transistor. In addition, an amorphous crystal silicon (a-Si:H) transistor, a low temperature polysilicon (LTPS) transistor, an indium gallium zinc oxide (IGZO) transistor, or another suitable transistor may also be used in accordance with some embodiments, but it is not limited thereto.

Figure 6:
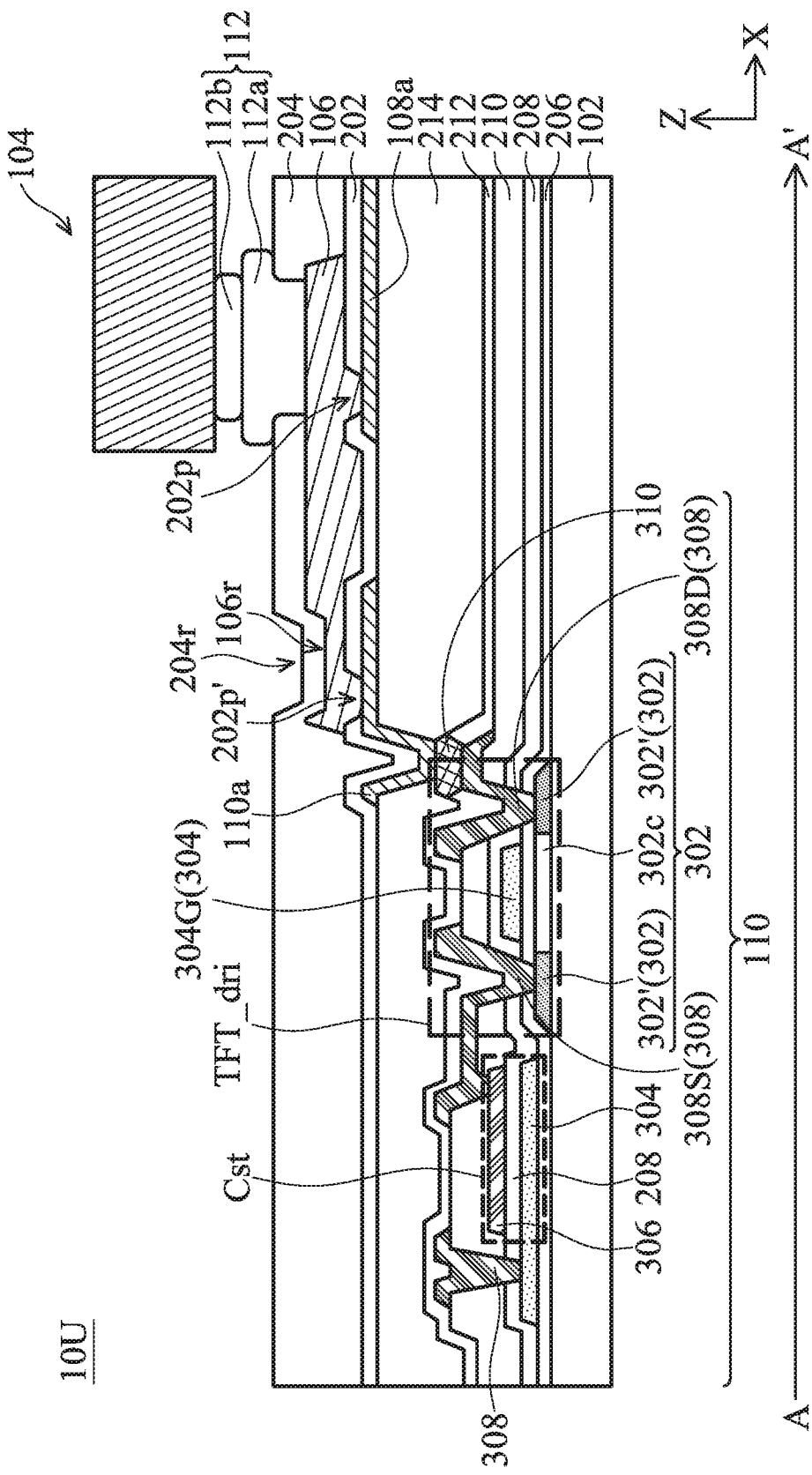
FIG. 6 illustrates a cross-sectional diagram of an electronic unit along the line-segment A-A' in FIG. 3A in accordance with some embodiments of the present disclosure.

FIG. 6 illustrates a cross-sectional diagram of the electronic unit 10U along the line-segment A-A' in FIG. 3A in accordance with some embodiments, wherein the conductive path between the first driving circuit 108 and the light-emitting diode 104 is disconnected shown in FIG. 6, the first driving circuit 108 is electrically insulated from the light-emitting diode 104, and the second driving circuit 110 is electrically connected to the light-emitting diode 104. As shown in FIG. 6, the dielectric layer 202 may include the hole 202p' that exposes a portion of the second output wire 110a, and the conductive structure 106 may be electrically connected to the second output wire 110a through the hole 202p'. Specifically, the conductive structure 106 may be disposed (or filled) in the hole 202p', and the conductive structure 106 may be electrically connected to or be in contact with the second output wire 110a, but it is not limited thereto.

Figure 7:
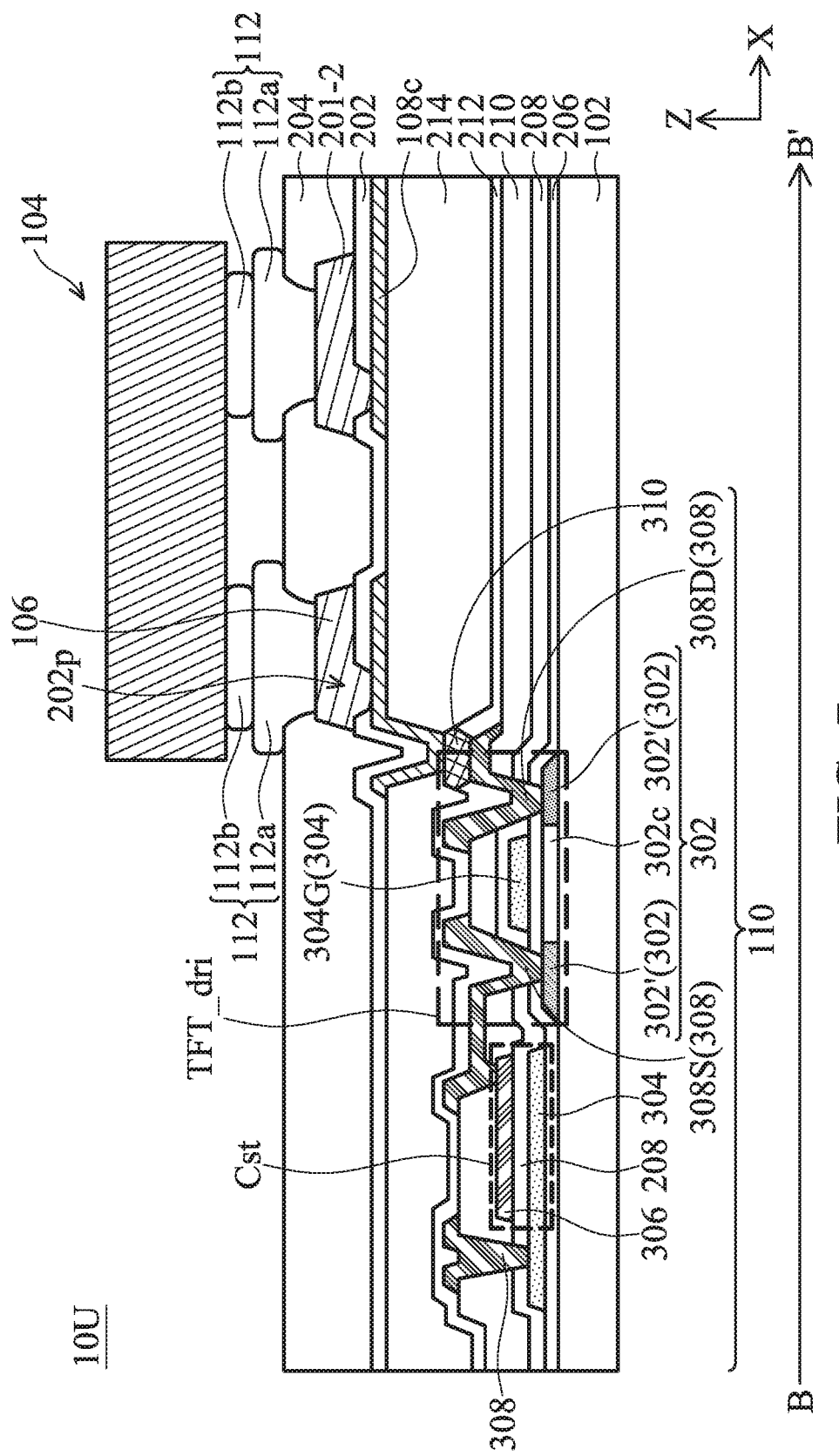
FIG. 7 illustrates a cross-sectional diagram of an electronic unit along the line-segment B-B' in FIG. 2A in accordance with some embodiments of the present disclosure.

FIG. 7 illustrates a cross-sectional diagram of the electronic unit 10U along the line-segment B-B' in FIG. 2A in accordance with some other embodiments. The first driving circuit 108 is electrically connected to the light-emitting diode 104 shown in FIG. 7. In some embodiments, the conductive structure 106 may be electrically connected to the first driving circuit 108 through the hole 202p of the dielectric layer 202. In some embodiments, the conductive structure 106 may be electrically connected to the light-emitting diode 104 by the connecting element 112. That is, the first output wire 108a may be electrically connected to one end of the light-emitting diode 104 (the cathode or anode end) by the conductive structure 106 and the connecting element 112, but it is not limited thereto. In some embodiments, one of the cathode and anode of the light-emitting diode 104 may correspond to (or overlap) the conductive structure 106, and the another of the cathode and the anode of the light-emitting diode 104 may correspond to (or overlap) the conductive pad 201-2 or a wire 108c. The wire 108c may be connected to an electrical potential, such as a negative potential or a ground potential, as illustrated by the Vss shown in FIG. 2A.

It should be noted that, the connection relationships between the source electrode, the drain electrode and other components shown in the above figures are exemplary embodiments. In other embodiments, the source electrode and the drain electrode may be interchanged according to requirements.

In some embodiments, an area of the conductive structure 106 may be greater than an area of the connecting element 112 from the top-view perspective along the Z direction. The area of the conductive structure 106 may be defined as a projection area of the conductive structure 106 on the substrate 102, and an area of the connecting element 112 may be defined as a projection area of the connecting element 112 on the substrate 102. In some embodiments, the width of the conductive structure 106 may be greater than or equal to the width of the first output wire 108a (or the second output wire 110a) from the top-view perspective along the Z direction. The width of the above component may be defined as the maximum width of the component in a direction that is perpendicular to an extending direction of the component.

The area of the above components may be measured by an optical microscopy (OM) or another suitable method. The width of the above components may be determined by measuring a maximum width of the component in any OM image.

Figure 8:
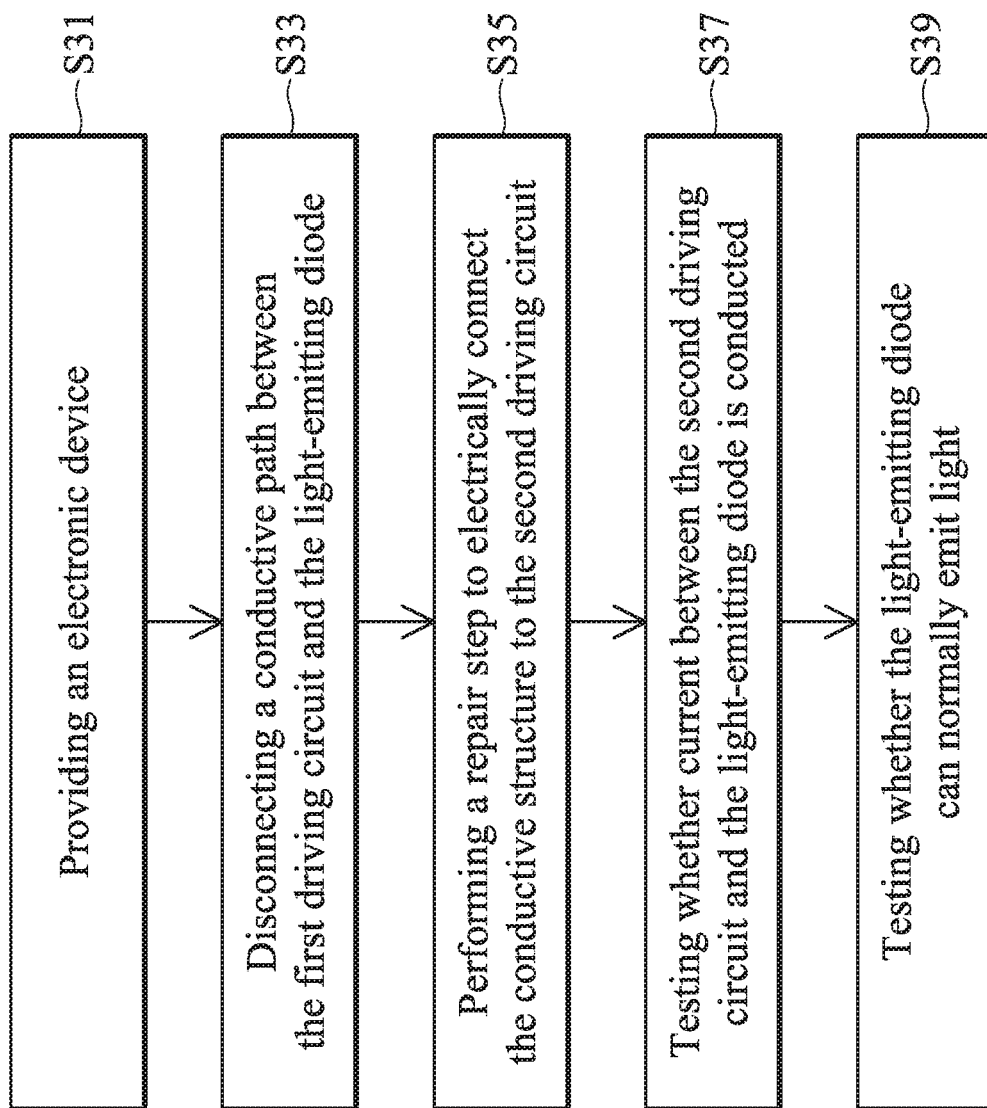
FIG. 8 illustrates a flowchart of a method for repairing an electronic device in accordance with some embodiments of the present disclosure.

FIG. 8 illustrates a flowchart of a method for repairing an electronic device 30 in some embodiments. It should be understood that additional operations can be provided before, during, and/or after the method for repairing an electronic device 30 in some embodiment. Some of the operations described can be replaced, interchanged or omitted in some other embodiments.

The method for repairing an electronic device 30 may include providing the electronic device 10 (step S31), which may refer to the embodiments shown in FIG. 2B (or FIG. 2C) for a description of the structure of the electronic device 10. The first driving circuit 108 (preset driving circuit) may be electrically connected to the light-emitting diode 104 by the conductive structure 106, and the second driving circuit 110 (the spare driving circuit) may be electrically insulated from the light-emitting diode 104.

Moreover, the method for repairing an electronic device 30 may also include disconnecting the conductive path between the first driving circuit 108 and the light-emitting diode 104 (step S33). In some embodiments, the first driving circuit 108 may be insulated from the light-emitting diode 104 by disconnecting (cutting off) the output wire (the first output wire 108a) of the first driving circuit 108, or disconnecting the conductive path between the first output wire 108a and the driving transistor TFT_dri, but it is not limited thereto. In some embodiments, the conductive path between the first output wire 108a and the driving transistor TFT_dri may be disconnected by using laser or another suitable method.

In addition, the method for repairing an electronic device 30 may also include performing a repair step S to electrically connect the conductive structure 106 to the second driving circuit (step S35). In some embodiments, the repair step S may include a laser melting process. For example, the laser melting process may remove a portion of the dielectric layer 202 between the conductive structure 106 and the second output wire 110a (refer to the dielectric layer 202 in FIG. 6), and the conductive structure 106 may be electrically connected to the second output wire 110a. Specifically, as shown in FIG. 6, the removed portion of the dielectric layer 202 may form the hole 202p', and a portion of the conductive structure 106 may be melted and disposed (or filled) in the hole 202p' of the dielectric layer 202. Therefore, the conductive structure 106 may be in contact with or electrically connected to the second output wire 110a, and the current path (i.e. conductive path) may be generated between the second driving circuit 110 (spare driving circuit) and the light-emitting diode 104.

In some embodiments, the method for repairing an electronic device 30 may include testing whether current between the second driving circuit 110 and the light-emitting diode 104 is conducted (step S37), and/or testing whether the light-emitting diode 104 can normally emit light (step S39). The above-mentioned "normally emit light" means that the light-emitting luminance of the light-emitting diode 104 meets to the specifications, but it is not limited thereto.

In some embodiments, the current between the driving circuit (the first driving circuit 108 or the second driving circuit 110) and the light-emitting diode 104 may be tested by a current measuring instrument. The measuring instrument may include, but is not limited to, a volt-ohm-milliammeter, a multi-functional digital power meter or another suitable measuring instrument. Another suitable method may also be used to test whether the current is conducted or the light-emitting diode 104 can normally emit light according to needs.

To summarize the above, the electronic device provided in the embodiments of the present disclosure may include the preset driving circuit, the spare driving circuit and the conductive structure. In addition, the conductive structure may partially overlap the output wires of the preset driving circuit and the spare driving circuit, and thereby the complicated steps for repairing the circuit or the time required for repairing the circuit may be reduced.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electronic device, comprising:
a substrate; and
an electronic unit disposed on the substrate, comprising:
a light-emitting diode;
a conductive structure disposed between the light-emitting diode and the substrate;
a first driving circuit comprising a first output wire; and
a second driving circuit comprising a second output wire;
wherein the first driving circuit is electrically connected to the light-emitting diode by the conductive structure, the second driving circuit is electrically insulated from the light-emitting diode, and the conductive structure at least partially overlaps the first output wire and the second output wire in a normal direction of the substrate.

2. The electronic device as claimed in claim 1, wherein the electronic unit further comprises a dielectric layer, the dielectric layer is disposed between the conductive structure and the first output wire, and the dielectric layer is disposed between the conductive structure and the second output wire in the normal direction of the substrate.

3. The electronic device as claimed in claim 2, wherein the dielectric layer comprises a hole, and the conductive structure is electrically connected to the first output wire through the hole.

4. The electronic device as claimed in claim 3, wherein a portion of the conductive structure is disposed in the hole and in contact with the first output wire.

5. The electronic device as claimed in claim 1, wherein the conductive structure is disposed on the first output wire and the second output wire.

6. The electronic device as claimed in claim 1, wherein the conductive structure is disposed between the first output wire and the substrate, and the conductive structure is disposed between the second output wire and the substrate.

7. The electronic device as claimed in claim 1, wherein the first driving circuit and the second driving circuit each comprise a driving transistor, and the driving transistor comprises a gate electrode, a drain electrode and a source electrode, wherein the conductive structure is the same layer as the gate electrode.

8. The electronic device as claimed in claim 1, wherein the first driving circuit and the second driving circuit each comprise a driving transistor, and the driving transistor comprises a gate electrode, a drain electrode and a source electrode, wherein the conductive structure is the same layer as the drain electrode or the source electrode.

9. The electronic device as claimed in claim 1, wherein the electronic unit further comprises a switching transistor electrically connected to the first driving circuit and the second driving circuit.

10. The electronic device as claimed in claim 1, wherein a ratio of an area of the conductive structure to an area of the electronic unit in the normal direction of the substrate is in a range from 0.005 to 0.5.

11. The electronic device as claimed in claim 1, further comprising a protective layer and a connecting element, wherein the protective layer is disposed on the conductive structure, and the connecting element is disposed between the light-emitting diode and the conductive structure.

12. The electronic device as claimed in claim 11, wherein the protective layer comprises a hole, and the connecting element is electrically connected to the conductive structure through the hole.

13. The electronic device as claimed in claim 11, wherein an area of the conductive structure is greater than an area of the connecting element.

14. The electronic device as claimed in claim 11, further comprising a conductive pad disposed between the connecting element and the first output wire, wherein the conductive pad partially overlaps the first output wire and the connecting element.

* * * * *